(12) United States Patent
Nishizawa et al.

(10) Patent No.: US 6,334,901 B1
(45) Date of Patent: Jan. 1, 2002

(54) APPARATUS FOR FORMING SEMICONDUCTOR CRYSTAL

(75) Inventors: Junichi Nishizawa, 6-16, Komegafukuro 1-chome; Hitoshi Abe, 22-11, Midorigaoka 1-chome, both of Sendai-shi, Miyagi-ken (JP)

(73) Assignees: Japan Science and Technology Corporation, Tokyo; Junichi Nishizawa; Hitoshi Abe, both of Sendai, all of (JP)

( * ) Notice: Subject to any disclaimer, the term of this patent is extended or adjusted under 35 U.S.C. 154(b) by 0 days.

(21) Appl. No.: 08/812,069

(22) Filed: Jun. 7, 1995

Related U.S. Application Data

(63) Continuation of application No. 07/204,992, filed on Jun. 7, 1988, now abandoned, which is a continuation of application No. 07/022,575, filed on Mar. 3, 1987, now abandoned, which is a continuation of application No. 06/759,097, filed on Jul. 25, 1985, now abandoned.

(30) Foreign Application Priority Data

Jul. 26, 1984 (JP) .................................................. 59-153973

(51) Int. Cl.[7] .................................................. G23C 16/22
(52) U.S. Cl. .......................................... 118/725; 117/102
(58) Field of Search .................................... 156/610, 613, 156/611, 614, DIG. 73, DIG. 50; 422/245; 118/725, 729; 427/33, 1, 54.1, 87, 86, 248.1, 255.1; 219/411, 409; 117/88, 102, 108

(56) References Cited

U.S. PATENT DOCUMENTS

| | | | | | |
|---|---|---|---|---|---|
| 4,435,445 A | * | 3/1984 | Allred et al. | ................. | 427/54.1 |
| 4,451,503 A | * | 5/1984 | Blum | ........................... | 427/53.1 |
| 4,509,451 A | * | 4/1985 | Collins et al. | ............... | 118/50.1 |
| 4,529,617 A | * | 7/1985 | Paule et al. | ..................... | 427/86 |
| 4,540,466 A | * | 9/1985 | Nishizawa | ..................... | 156/643 |
| 4,558,660 A | * | 12/1985 | Nishizawa et al. | .......... | 118/725 |
| 4,569,855 A | * | 2/1986 | Matsuda et al. | ............... | 427/86 |
| 4,806,321 A | * | 2/1989 | Nishizawa et al. | .......... | 422/245 |
| 4,834,831 A | * | 5/1989 | Nishizawa et al. | .......... | 156/611 |
| 4,859,625 A | * | 8/1989 | Nishizawa et al. | ............ | 437/81 |
| 5,035,767 A | * | 7/1991 | Nishizawa et al. | .......... | 156/613 |
| 5,250,148 A | * | 10/1993 | Nishizawa et al. | .......... | 156/611 |
| 5,294,286 A | * | 3/1994 | Nishizawa et al. | .......... | 156/610 |
| 5,443,033 A | * | 8/1995 | Nishizawa | ....................... | 117/86 |
| 5,693,139 A | * | 12/1997 | Nishizawa et al. | ............ | 117/89 |

OTHER PUBLICATIONS

Nishizawa, Japanese Society of Applied Physics v53, #6, Jun. '84 Translation Crystal Growth By Atomic Layer Epitaxy, pp. 516–520.*

* cited by examiner

Primary Examiner—Wayne Langel
(74) Attorney, Agent, or Firm—Armstrong, Westerman, Hattori, McLeland & Nayghton, LLP

(57) ABSTRACT

In a semiconductor crystal growth apparatus, a substrate is heated in a growth vessel evacuated to a ultrahigh vacuum, and gas containing component elements of a semiconductor which should grow on the substrate are introduced into the growth vessel from external gas sources. Radiation having a specific wavelength is directed from an external irradiation source toward and onto the substrate.

5 Claims, 4 Drawing Sheets

APPARATUS FOR FORMING SEMICONDUCTOR CRYSTAL

This application is a continuation of application Ser. No. 07/204,992 filed Jun. 7, 1988, abandoned, which is a continuation of Ser. No. 07/022,575 filed Mar. 3, 1987, abandoned, which is a continuation of 06/759,097 filed Jul. 25, 1985 now abandoned.

FIELD OF THE INVENTION

This invention relates to an apparatus for a crystal of a semiconductor, which is suitable for formation of a semiconductor crystal growth layer with precision as precise as a single molecular layer.

DESCRIPTION OF THE PRIOR ART

A metal-organic chemical vapor deposition process (referred to hereinafter as an MO-CVD process) and a molecular beam epitaxy (referred to hereinafter as an MBE process) are well known in the art as vapor phase epitaxial techniques for forming a crystalline thin film of a semiconductor. According to the MO-CVD process, elements of the III and V groups, which are sources, and hydrogen or like gas, which is a carrier, are simultaneously introduced into a reaction chamber to cause growth of a crystal by means of thermal decomposition. However, the thermal decomposition results in a poor quality of the crystal layer formed by growth. The MO-CVD process is also defective in that difficulty is encountered for controlling the thickness of the layer with precision as precise as a single molecular layer.

On the other hand, the MBE process is well known as a crystal growth process making use of a ultrahigh vacuum. This process, however, includes physical adsorption as its first step. Therefore, the quality of the crystal is inferior to that provided by the CVD process which makes use of a chemical reaction. For the growth of a III-V compound semiconductor such as GaAs according to the MBE process, such elements of the III and V groups are used as sources, and the sources themselves are disposed in a growth chamber. Therefore, it is difficult to control the amount of gases produced by heating the sources, to control the rate of vaporization of the sources and to replenish the sources, resulting in difficulty of maintaining a constant growth rate for a long period of time. Further, the evacuating device for exhausting, for example, the vaporized matters becomes complex in construction. Furthermore, it is difficult to precisely control the stoichiometric composition of the compound semiconductor. Consequently, the MBE process is defective in that a crystal of high quality cannot be obtained.

SUMMARY OF THE INVENTION

It is a primary object of the present invention to provide an apparatus for forming a crystal of a semiconductor, which can cause growth of a high-quality crystal layer of high purity on a substrate with precision as precise as a single molecular layer.

In accordance with the present invention, there is provided an apparatus for forming a crystal of a semiconductor comprising a growth vessel enclosing a substrate, means for heating the substrate, means for evacuating the growth vessel to a ultrahigh vacuum, nozzle means connected to external gas sources for introducing gaseous molecules containing those of component elements of a crystal which should grow on the substrate disposed in the growth vessel, and radiation emitting means for emitting and directing radiation having a wavelength of 180 to 600 nm toward and onto the substrate, whereby a semiconductor crystal growth layer having a predetermined film thickness is formed on the substrate with precision as precise as a single molecular layer.

Thus, by the provision of the means for emitting and directing radiation having a wavelength of 180 to 600 nm toward and onto the substrate, the temperature of the substrate can be suppressed to a low level. Consequently, a semiconductor crystal of high quality satisfying the stoichiometric composition can be provided. Further, when a nozzle for introducing an impurity gas is additionally provided in the growth vessel, any one of desired layers can be doped with the impurity, and the resultant film has a very steep impurity concentration distribution, thereby providing a semiconductor device capable of operation at a very high speed.

DESCRIPTION OF THE PREFERRED EMBODIMENTS

Before describing the present invention in detail, the construction and operation of a prior art, semiconductor crystal forming apparatus developed previously by the inventors will be briefly described for a better understanding of the present invention.

Figure 1:
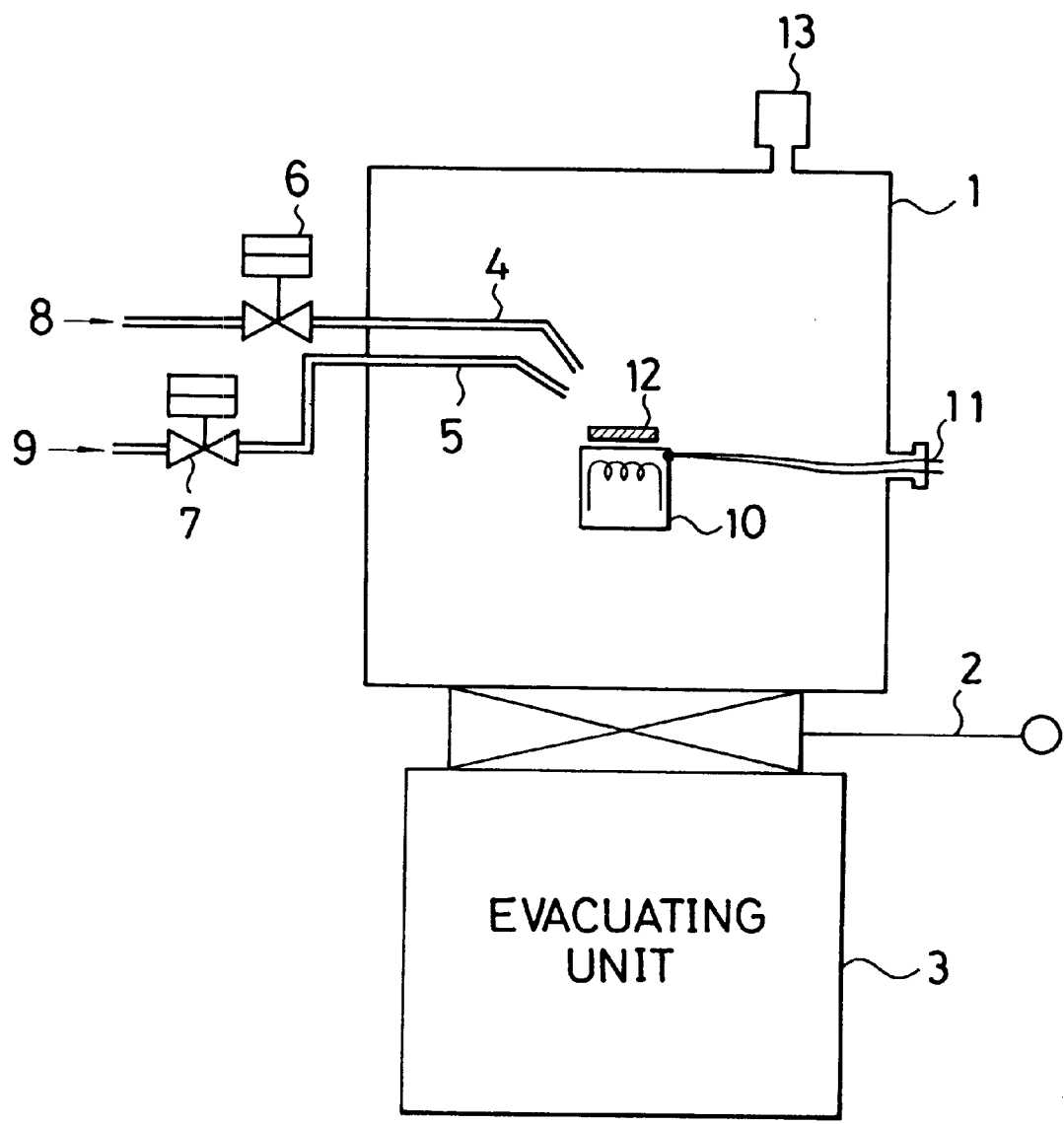
FIG. 1 is a diagrammatic view showing the construction of a prior art, semiconductor crystal forming apparatus developed previously by the inventors.

Referring to FIG. 1, a crystal growth vessel 1 is made of a metal such as stainless steel. The vessel 1 is coupled through a gate valve 2 to an evacuating unit 3 which evacuates the interior of the vessel 1 to a ultrahigh vacuum. Nozzles 4 and 5 extend into the crystal growth vessel 1 for introducing gaseous compounds containing component elements of the III and V groups respectively thereby causing growth of a III-V compound semiconductor on a substrate 12 disposed in the crystal growth vessel 1. The nozzles 4 and 5 are provided with on-off valves 6 and 7 controlling the introduced amounts of the gaseous compounds 8 and 9 containing the component elements of the III and V groups respectively. A heater 10 for heating the substrate 12 is disposed in the growth vessel 1, and a thermocouple 11 is associated with the heater 10 for measuring the temperature of the substrate 12. The heater 10 includes a tungsten filament sealed in a quartz glass tube, and the substrate 12 of a compound semiconductor is mounted on the heater 10. A pressure gauge 13 for measuring the value of the internal vacuum is disposed on the growth vessel 1.

A monocrystalline thin film of a compound semiconductor is formed in a manner as described hereinunder by the crystal forming apparatus having the construction shown in FIG. 1. Suppose, for example, the case of epitaxial growth of a single crystal of GaAs on the substrate 12 of GaAs. First, the growth vessel 1 is evacuated to a vacuum of about $10^{-7}$ to $10^8$ Pascal (abbreviated hereinafter as Pa) by opening the gate valve 2 and operating the ultrahigh-vacuum evacuating unit 3. Then, the GaAs substrate 12 is heated up to 300 to 800° C. by the heater 10, and gaseous TMG (trimethyl gallium) 8 is introduced, as gas containing Ga, into the growth vessel 1 by holding the valve 6 open for 0.5 to 10 sec and maintaining the internal pressure of the growth vessel at $10^{-1}$ to $10^{-7}$ Pa. After closing the valve 6 and exhausting the gas from within the growth vessel 1, gaseous AsH$_3$ (arsine) 9 is introduced, as gas containing As, into the growth vessel 1 by holding the valve 7 open for 2 to 200 sec and maintaining the internal pressure of the growth vessel 1 at $10^{-1}$ to $10^{-7}$ Pa. As a result, at least one molecular layer of GaAs grows on the substrate 12.

Thus, according to the crystal growth apparatus proposed previously by the inventors, growth of a monocrystalline thin film of GaAs having a desired thickness can be attained with precision as precise as a single molecular layer, by repeating the process of growth of the single molecular layer in the manner described above. However, in the growth vessel 1 of the semiconductor crystal growth apparatus described above, the rate of epitaxial growth of the crystal is not high, and the growth temperature must be maintained at a high level, resulting in difficulty of forming a crystal of good quality satisfying the stoichiometric composition.

With a view to solve the above problem, the present invention provides an improved semiconductor crystal growth apparatus according to which growth of a semiconductor crystal of good quality satisfying the stoichiometric composition can be attained.

Figure 2:
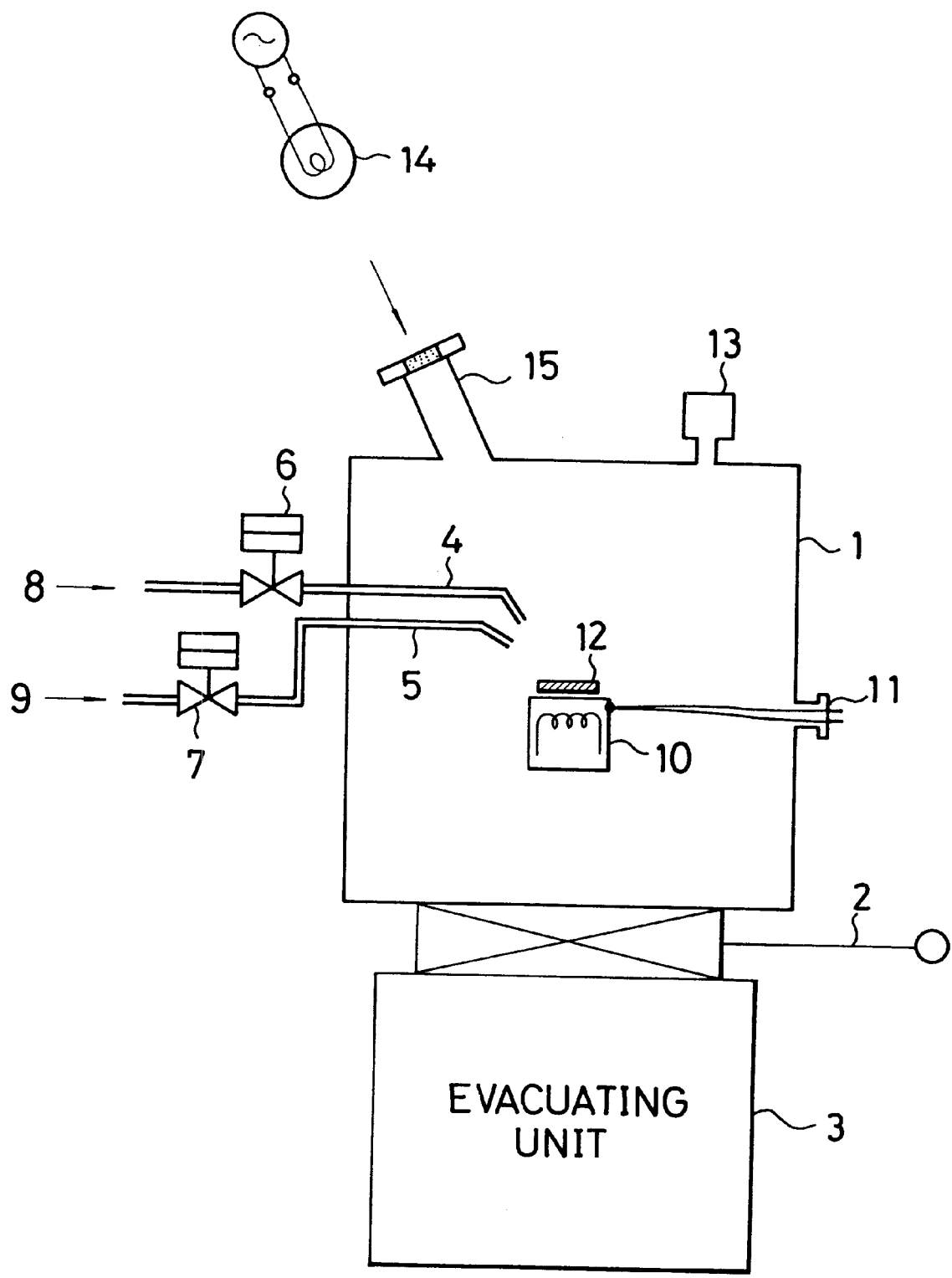
FIG. 2 is a diagrammatic view showing the construction of an embodiment of the semiconductor crystal forming apparatus according to the present invention.

FIG. 2 shows one of most preferred embodiments of the present invention, and, in FIG. 2, the same reference numerals are used to designate the same or equivalent parts appearing in FIG. 1. The apparatus shown in FIG. 2 differs from that shown in FIG. 1 in that a substrate irradiation source 14 and a port 15 having a window permitting transmission of radiation from the irradiation source 14 toward and onto the substrate 12 are additionally provided.

For example, a 500-W high-pressure mercury lamp is used as the irradiation source 14, and AsH$_3$ (arsine) and TMG (trimethyl gallium) are used as the compounds containing the elements of the III and V groups respectively. After opening the gate valve 2 and operating the ultrahigh vacuum evacuating unit 3 to evacuate the growth vessel 1 to a ultrahigh vacuum of about $10^{-7}$ to $10^{-8}$ Pa, the GaAs substrate 12 is heated up to, for example, about 300 to 800° C. by the heater 10. The valve 6 is held open for 4 sec to introduce the TMG gas at a pressure of $10^{-2}$ Pa, and the gas in the growth vessel 1 is then exhausted. Then, the valve 7 is held open for 20 sec to introduce the AsH$_3$ gas. The cycle including the above steps is repeated. During the periods of gas introduction, the radiation from the high-pressure mercury lamp 14 is continuously directed toward and onto the substrate 12 through the port 15 having the window. As a result, a crystal of GaAs grows on the substrate 12 in each cycle.

Figure 3:
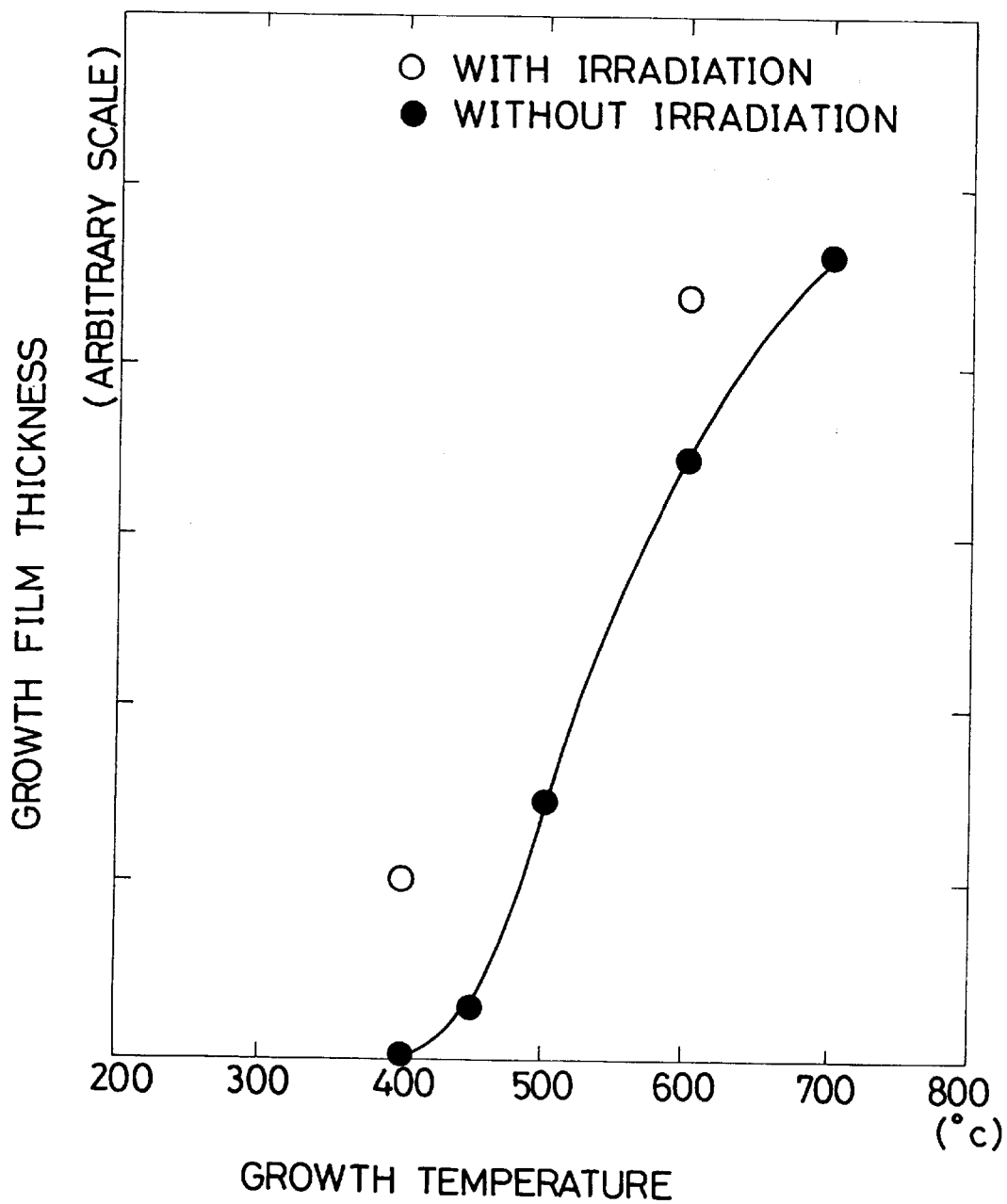
FIG. 3 is a graph showing the relation between the rate of growth and the growth temperature of the substrate.

FIG. 3 is a graph showing the relation between the rate of crystal growth and the growth temperature of the substrate 12. In FIG. 3, the black dot indicates the absence of the radiation, while the white dot indicates the presence of the radiation. It will be seen in FIG. 3 that crystal growth does not occur at the growth temperature of 400° C. It has however been confirmed that growth at a rate of 1.0 Å/cycle is attained even at the temperature of 400° C. when the radiation is directed toward and onto the substrate 12 while maintaining the same condition of gas introduction. The growth rate increases from 3.5 Å/cycle to 4.4 Å/cycle when the substrate is irradiated at the growth temperature of 600° C. Investigation of the electrical properties has proved that the impurity concentration is decreased, and the mobility of electrons and holes is improved.

During the process of crystal growth, the mercury lamp 14 may be discontinuously energized. The irradiation source is in no way limited to the high-pressure mercury lamp, and a lamp such as a heavy hydrogen lamp or a xenon lamp emitting radiation including ultraviolet radiation promoting the deposition and crystal growth on the surface of the substrate 12 in the gaseous environment of AsH$_3$ and TMG may be used. Also, a multiplied beam of an excimer laser, an argon laser or the like may be used. When the substrate 12 is irradiated with a multiplied Ar laser beam having a wavelength of 257 nm, the growth rate increases from 1.5 Å/cycle at the growth temperature of 500° C. Also, when the substrate 12 is irradiated with both of a multiplied Ar laser beam having a wavelength of 257 nm and its primary beam having a wavelength of 514 nm at the growth temperature of 500° C., the growth rate shows only a slight increase or increases to 4.2 Å/cycle, but the electrical properties of the crystal are greatly improved. That is, the impurity concentration is improved from $4.6 \times 10^{18}$ cm$^{-1}$ to $2.4 \times 10^{18}$ cm$^{-1}$, and the mobility of holes is improved from 84 cm$^2$V$^{-1}$S$^{-1}$ to 110 cm$^2$V$^-$S$^{-1}$. Further, the combination of some of these irradiation sources may be used. Further, the continuous emission of radiation from the Ar laser or mercury lamp may be synchronized with the pulse-form gas introduction, or such a combination may be combined with an excimer laser beam emitted in pulse form with the same phase. Further, the compound containing Ga may be a halogen compound such as GaCl$_3$.

Figure 4:
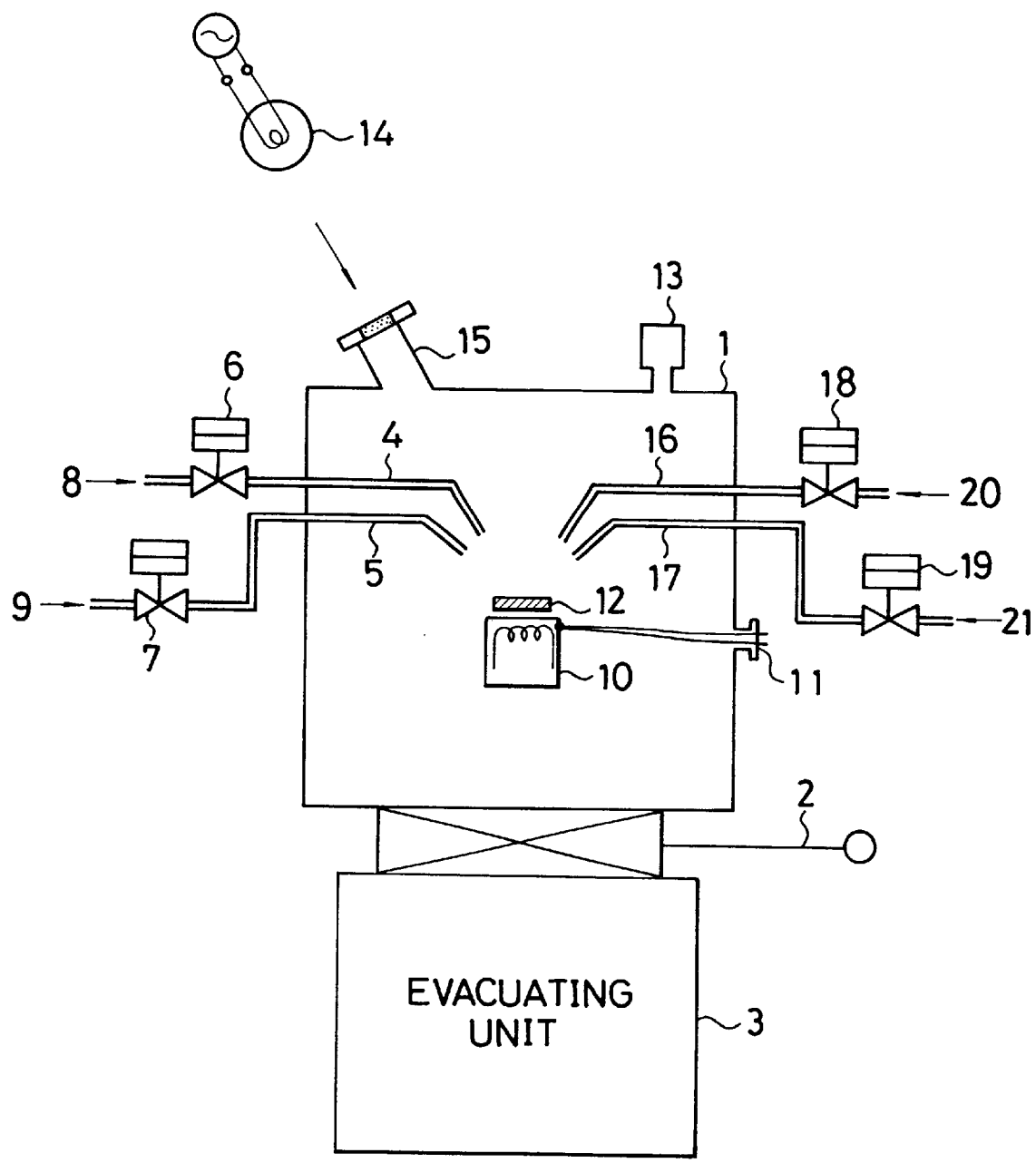
FIG. 4 is a diagrammatic view showing the construction of another embodiment of the present invention.

FIG. 4 shows another embodiment of the present invention which is designed for doping with impurities. Inasmuch as the embodiment shown in FIG. 4 is a modification of that shown in FIG. 2, the same reference numerals are used to designate the same or equivalent parts appearing in FIG. 2. The embodiment shown in FIG. 4 differs from that shown in FIG. 2 in that nozzles 16 and 17 are additionally provided for introducing gaseous compounds for doping with impurities respectively, and on-off valves 18 and 19 are provided on the nozzles 16 and 17 respectively, so that controlled amounts of a gaseous compound 20 containing an element of the II group and another gaseous compound 21 containing an element of the IV group can be introduced into the growth vessel 1.

Suppose now the case of formation of a p-type growth layer by the apparatus shown in FIG. 4. In this case, three gases, for example, gaseous TMG (trimethyl gallium) 8, gaseous AsH$_3$ (arsine) and gaseous ZMZn (dimethyl zinc) 20 which is an impurity gas are cyclically introduced into the growth vessel 1. As another method, the TMG gas 8 and ZMZn gas 20 are introduced simultaneously but alternately with the AsH$_3$ gas 9, or the AsH$_3$ gas 9 and ZMZn gas 20 are introduced simultaneously but alternately with the TMG gas 8, for doping with the p-type impurity.

The impurity gas may be ZMCd gas (dimethyl cadmium), ZMMg gas (dimethyl magnesium), SiH$_4$ gas (monosilane), GeH$_4$ gas (germane) or the like.

On the other hand, when formation of an n-type growth layer is desired, gaseous ZMSe (dimethyl selenium) 21, which is an impurity gas, gaseous TMG B and gaseous AsH$_3$ 9 are cyclically introduced into the growth vessel 1. As another method, the TMG gas 8 and ZMSe gas 27 are introduced simultaneously but alternately with the AsH$_3$ gas 9 for doping with the n-type impurity.

The impurity gas may be ZMS gas (dimethyl sulfur), H$_2$S gas (hydrogen sulfide), H$_2$Se gas (hydrogen selenide) or the like.

In this case, the flow rate of the introduced impurity gas is preferably selected to be less by, for example, $10^{-3}$ to $10^{-6}$ than those of the $AsH_3$ gas 9 and TMG gas 8, and the length of time of gas introduction is preferably selected to be about 0.5 to 10 sec so as to form a molecular epitaxial growth layer having a desired impurity concentration distribution in the thicknesswise direction. Further, it is apparent that, by suitably regulating the amount and duration of introduction of the impurity gases, it is possible to provide pn junctions, non-uniform impurity concentration distributions, bipolar transistor structures such as npn, npin, pnp and pnip structures, field effect transistor structures such as $n^+in^+$ and $n^+n^-n^+$ structures, electrostatic induction transistor structures, pnpn thyristor structures, etc.

The aforementioned embodiments have referred principally to the formation of a crystal growth layer of GaAs by way of example. However, it is apparent that the present invention is equally effectively applicable to the formation of III-V compounds including InP, AlP and GaP. The present invention is also applicable to the formation of mixed crystals such as $Ga_{(1-x)}Al_xAs$ and $Ga_{(1-x)}Al_xAs_{(1-y)}P_y$. Also, the material of the substrate is in no way limited to GaAs, and a substrate of any other compound semiconductor may be used for the growth of a hetero epitaxial layer.

Further, although the aforementioned embodiments have referred to the formation of a compound semiconductor by way of example, the present invention is in no way limited to the formation of such a specific semiconductor and is equally effectively and successfully applicable to the crystal growth of an element semiconductor of a single element such as that belonging to the IV group. In such a case, crystal growth can be attained by the combination of $H_2$ gas and reactive gas such as $SiCl_4$, $SiHCl_3$, $SiH_2Cl_2$ or like chloride, when the element semiconductor is silicon.

In the aforementioned embodiments, the heat source is disposed inside the growth vessel 1. However, a heat source such as an infrared emitting lamp may be disposed outside the growth vessel 1 to direct heat rays toward and onto the substrate 12 through an optical window thereby heating the substrate 12 up to a predetermined temperature.

What is claimed is:

1. An apparatus for forming a crystal of a semiconductor, comprising a growth vessel enclosing a substrate, means for heating said substrate, means for evacuating said growth vessel to a vacuum, a pulse-form gas introduction nozzle means connected to external gas sources for alternately introducing a respective component element of a compound crystal to be grown on said substrate disposed in said growth vessel, radiation emitting means, synchronized with said pulse-form gas introduction nozzle means, for emitting and directing radiation having a wavelength of 180 to 600 nm toward and onto said substrate, said radiation emitting means located outside the growth vessel, and a window pane portion, having a window pane material which is transparent to said radiation, located at a wall of the growth vessel for directing said radiation toward said substrate, such that a semiconductor growth layer having a film thickness as small as a single molecule layer is formed on said substrate.

2. An apparatus as claimed in claim 1, wherein said growth vessel encloses said substrate on which said semiconductor growth layer is a crystal of a compound semiconductor consisting of at least two component elements.

3. An apparatus as claimed in claim 2, wherein said compound semiconductor is GaAs.

4. An apparatus as claimed in claim 1, wherein said radiation emitting means emits radiation of at least two different wavelengths.

5. An apparatus as claimed in claim 1, wherein said evacuating means evacuates to a vacuum of about $10^{-7}$ to $10^{-8}$ Pascal.

* * * * *